(12) United States Patent
Park et al.

(10) Patent No.: US 9,059,121 B2
(45) Date of Patent: Jun. 16, 2015

(54) ORGANIC LIGHT EMITTING DISPLAY AND METHOD FOR MANUFACTURING THE SAME

(71) Applicant: Samsung Display Co., Ltd., Gyeonggi-do (KR)

(72) Inventors: Kyung-Hoon Park, Yongin (KR); Jong-Hyun Park, Yongin (KR); Seong-Kweon Heo, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/041,159

(22) Filed: Sep. 30, 2013

(65) Prior Publication Data

US 2014/0346454 A1     Nov. 27, 2014

(30) Foreign Application Priority Data

May 21, 2013   (KR) .......................... 10-2013-0057300

(51) Int. Cl.
*H01L 51/52*   (2006.01)
*H01L 27/32*   (2006.01)
*H01L 51/56*   (2006.01)

(52) U.S. Cl.
CPC ............ *H01L 27/3262* (2013.01); *H01L 51/56* (2013.01); *H01L 51/5203* (2013.01)

(58) Field of Classification Search
CPC .. H01L 27/3262; H01L 51/52; H01L 51/5203
USPC ................................................ 257/40; 438/99
See application file for complete search history.

(56) References Cited

U.S. PATENT DOCUMENTS

| | | | |
|---|---|---|---|
| 8,278,664 B2* | 10/2012 | Hwang et al. | 257/72 |
| 2004/0253756 A1* | 12/2004 | Cok et al. | 438/22 |
| 2006/0125381 A1* | 6/2006 | Oh | 313/504 |
| 2006/0290828 A1* | 12/2006 | Hwang et al. | 349/43 |
| 2007/0188087 A1* | 8/2007 | Kwon et al. | 313/506 |
| 2010/0051910 A1* | 3/2010 | Choi | 257/40 |
| 2010/0065849 A1* | 3/2010 | Lee et al. | 257/72 |
| 2011/0114960 A1* | 5/2011 | Lee et al. | 257/71 |
| 2012/0074412 A1 | 3/2012 | Kim | |
| 2012/0074413 A1 | 3/2012 | Kim | |
| 2012/0205673 A1 | 8/2012 | Park et al. | |

FOREIGN PATENT DOCUMENTS

| | | |
|---|---|---|
| KR | 10-2012-0032905 | 4/2012 |
| KR | 10-2012-0032906 | 4/2012 |
| KR | 10-2012-0091855 | 8/2012 |

\* cited by examiner

*Primary Examiner* — Allan R Wilson
(74) *Attorney, Agent, or Firm* — Lee & Morse, P.C.

(57) ABSTRACT

An organic light emitting display includes a substrate, a metal pattern on the substrate, the metal pattern directly contacting the substrate, and a thin film transistor including an active layer spaced apart from the metal pattern on the substrate, a gate electrode on the active layer, and a source electrode and a drain electrode on the gate electrode.

16 Claims, 4 Drawing Sheets

ORGANIC LIGHT EMITTING DISPLAY AND METHOD FOR MANUFACTURING THE SAME

CROSS-REFERENCE TO RELATED APPLICATION

Korean Patent Application No. 10-2013-0057300 filed on May 21, 2013, in the Korean Intellectual Property Office, and entitled: "ORGANIC LIGHT EMITTING DISPLAY AND METHOD FOR MANUFACTURING THE SAME," is incorporated by reference herein in its entirety.

BACKGROUND

1. Field

Embodiments relate to an organic light emitting display and a method for manufacturing the same.

2. Description of the Related Art

Flat panel displays, such as organic light-emitting displays or liquid crystal displays, are manufactured on a substrate on which a pattern including a thin film transistor (TFT), a capacitor, and wirings for connecting these elements are formed.

SUMMARY

Embodiments are directed to an organic light emitting display, including a metal pattern on the substrate, the metal pattern directly contacting the substrate, and a thin film transistor including an active layer spaced apart from the metal pattern on the substrate, a gate electrode on the active layer, and a source electrode and a drain electrode on the gate electrode.

The active layer may not directly contact the substrate.

The metal pattern may not be in a region of the substrate in which the active layer is located.

The metal pattern may include a lower layer including a transparent conductive metal oxide and an upper layer including a conductive material.

The upper layer of the metal pattern may include at least one material selected from Ag, Mg, Al, Pt, Pd, Au, Ni, Nd, Ir, Cr, Li, Ca, Mo, Ti, W, MoW, and Cu.

The organic light emitting display may further include an auxiliary layer between the metal pattern and the active layer, the auxiliary layer having a stepped portion based on the metal pattern.

The organic light emitting display may further include a gate insulating layer between the active layer and the gate electrode. The gate insulating layer may be controlled in step coverage through the stepped portion of the auxiliary layer.

The organic light emitting display may further include a pixel electrode formed of a same material and in a same layer as the metal pattern, the pixel electrode directly contacting the substrate.

Embodiments are also directed to an organic light emitting display including a substrate, a metal pattern on the substrate, an auxiliary layer on the metal pattern, an active layer on the auxiliary layer, a gate insulating layer on the active layer, a gate electrode on the gate insulating layer, a source electrode and a drain electrode on the gate electrode, the source electrode and the drain electrode being electrically connected, respectively, to a source region and a drain region of the active layer, and a pixel electrode electrically connected to one of the source electrode and the drain electrode.

The metal pattern may directly contact the substrate except for in a region in which the active layer is disposed.

The auxiliary layer may include a stepped region based on the metal pattern. The gate insulating layer may be controlled in step coverage through the stepped region of the auxiliary layer.

The metal pattern may be provided as a multiple layer.

The pixel electrode may be formed of a same material and on a same layer as a lower layer of the metal pattern and directly contacts the substrate.

Embodiments are directed to a method for manufacturing an organic light emitting display including forming a first metal pattern on the substrate such that the first metal pattern directly contacts the substrate, and forming a thin film transistor including an active layer, a gate electrode formed on the active layer, and a source electrode and a drain electrode formed on the gate electrode.

The first metal pattern may not be formed in a region in which the active layer is to be formed.

Forming the first metal pattern may include stacking a lower conductive layer including a transparent conductive metal oxide and an upper conductive layer including a conductive material and patterning the lower conductive layer and the upper conductive layer.

The upper conductive layer of the first metal pattern may include at least one material selected from Ag, Mg, Al, Pt, Pd, Au, Ni, Nd, Ir, Cr, Li, Ca, Mo, Ti, W, MoW, and Cu.

Forming the thin film transistor may include forming an auxiliary layer on the first metal pattern, forming the active layer on the auxiliary layer, forming a gate insulating layer on the active layer, forming the gate electrode on the gate insulating layer, forming an interlayer insulating layer on the gate electrode, and forming the source electrode and the drain electrode to be electrically connected, respectively, to a source region and a drain region of the active layer.

The auxiliary layer may include a stepped portion based on the first metal pattern. The gate insulating layer may be controlled in step coverage through the stepped portion of the auxiliary layer.

The method may further include forming a second metal pattern of a same material and in a same layer as the first metal pattern, forming a third metal pattern of a same material as the gate electrode on the second metal pattern, and removing the third metal pattern and an upper conductive layer of the second metal pattern while the source electrode and the drain electrode are formed, to form a pixel electrode.

The method may further include forming an auxiliary layer on the second metal pattern, forming a gate insulating layer on the auxiliary layer, patterning the auxiliary layer and the gate insulating layer to form a first opening exposing the second metal pattern, forming the third metal pattern on the first opening, forming an interlayer insulating layer on the third metal pattern, and forming the pixel electrode by removing the interlayer insulating layer, the third metal pattern, and the upper conductive layer of the second metal pattern while the source electrode and the drain electrode are formed.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
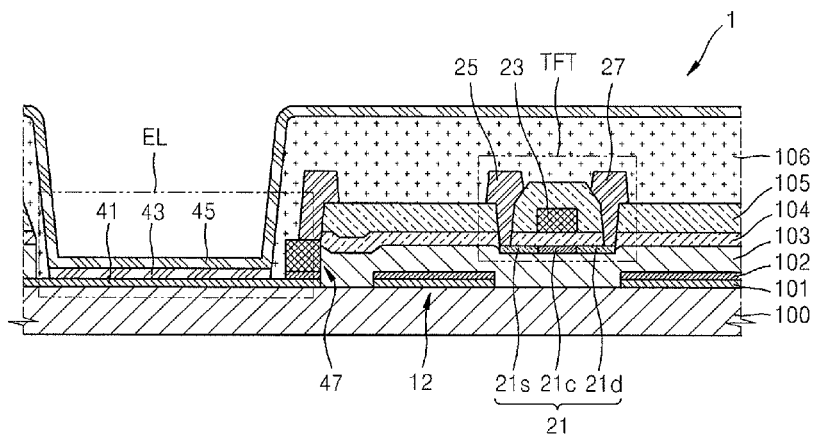
FIG. 1 illustrates a schematic cross-sectional view of an organic light emitting display 1 according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, throughout the specification, 'on' implies being positioned above or below a target element and does not imply being necessarily positioned on the top on the basis of a gravity direction.

Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of an organic light emitting display 1 according to an embodiment.

Referring to FIG. 1, the organic light emitting display 1 according to an embodiment may include a thin film transistor TFT serving as a driving device and an organic light emitting device EL on a substrate 100. Although only one thin film transistor TFT is illustrated in FIG. 1, in other implementations, a plurality of thin film transistors TFTs and a plurality of capacitors may be provided.

The thin film transistor TFT includes an active layer 21, a gate electrode 23, and source/drain electrodes 25 and 27 which may be disposed on the substrate 100. A first insulating layer 104 that is a gate insulating layer may be disposed between the gate electrode 23 and the active layer 21 to insulate the gate electrode 23 from the active layer 21. Also, source and drain regions 21s and 21d in which high-density impurities are doped may be defined in both edges of the active layer 21, respectively. Also, the source and drain regions 21s and 21d may be connected to the source and drain electrodes 25 and 27, respectively. A channel region 21c is defined between the source and drain regions 21s and 21d. A second insulating layer 105 that is an interlayer insulating layer is disposed between the source and drain electrodes 25 and 27 and the gate electrode 23 to insulate the source and drain electrodes 25 and 27 from the gate electrode 23.

A metal pattern 12 is provided in a region around the thin film transistor, excluding a region of the active layer 21. The metal pattern 12 may include a first metal layer 101 including a transparent conductive metal oxide and a second metal layer 102 including a conductive material. The metal pattern 12 directly contacts the substrate 100. An auxiliary layer 103 is disposed on the metal pattern 12. The auxiliary layer 103 may have a stepped portion due to the metal pattern 12 which is disposed under the auxiliary layer 103. For example, when the auxiliary layer 103 is formed, an area above the metal pattern 12 may have a greater height than other areas of the auxiliary layer due to the presence of the metal pattern 12 below. The active layer 21 may be disposed in a concave region that is defined by the stepped portion of the auxiliary layer 103. In an embodiment, a step coverage of the first insulating layer 104 that is the gate insulating layer may be controlled through the stepped portion of the auxiliary layer 103. For example, the first insulating layer 104 may have stepped portions that coincide with stepped portions of the underlying auxiliary layer 103.

The organic light emitting device EL may include a pixel electrode 41, an opposite electrode 45 facing the pixel electrode 41, and an intermediate layer 43 disposed between the pixel electrode 41 and the opposite electrode 45.

An edge portion of the pixel electrode 41 may be covered by a third insulating layer 106. The pixel electrode 41 may be disposed on the same layer as the first metal layer 101 of the metal pattern 12 and may directly contact the substrate 100. The pixel electrode 41 may be electrically connected to one of the source and drain electrodes 25 and 27 of the thin film transistor TFT by a metallic connecting layer 47. The metallic connecting layer 47 may include a lower layer that has the same material as the second metal layer 102 of the metal pattern 12 and an upper layer that has the same material as the gate electrode 23 of the thin film transistor TFT. The pixel electrode 41 formed of a transparent conductive oxide may have high resistance. Accordingly, the pixel electrode 41 may be connected to one of the source and drain electrodes 25 and 27 through the metallic connecting layer 47 having low resistance.

FIGS. 2 to 8 are schematic cross-sectional views illustrating stages of a manufacturing process of the organic light emitting display 1 shown in FIG. 1. Hereinafter, the manufacturing process of the organic light emitting display 1 illustrated in FIG. 1 will be described schematically.

Figure 2:
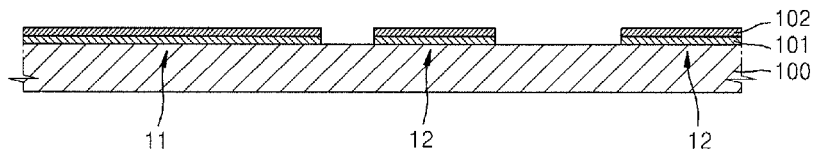
FIGS. 2 to 8 are schematic cross-sectional views illustrating stages of a manufacturing process of the organic light emitting display 1 shown in FIG. 1.

As shown in FIG. 2, a first metal pattern 12 and a second metal pattern 11 are formed on a substrate 100.

The substrate 100 may be formed of a transparent glass material mainly including $SiO_2$. In other implementation, the substrate may be formed of various other materials, such as a transparent plastic material or a metal material, and the like.

The first metal pattern 12 disperses the static electricity introduced from the substrate 100 to the thin film transistor TFT to prevent or hinder the static electricity from being introduced into the thin film transistor TFT. The first metal pattern 12 may be formed in a region excluding a region in which the active layer 21 of the thin film transistor TFT will be formed. The second metal pattern 11 may be formed in a region in which the pixel electrode 41 of the organic light emitting device EL will be formed.

A first conductive layer 101 and a second conductive layer 102 may be successively stacked on each other and then patterned by wet etching to form the first metal pattern 12 and the second metal pattern 11. The first conductive layer 101 may be formed of the transparent conductive oxide that includes, for example, at least one material selected from transparent materials such as ITO, IZO, ZnO, and $In_2O_3$. The second metal layer 102 may include at least one material selected from Ag, Mg, Al, Pt, Pd, Au, Ni, Nd, Ir, Cr, Li, Ca, Mo, Ti, W, MoW, and Cu. For example, the second metal layer 102 may include Mo for the protection of the first metal layer 101 in an etching process to be performed when the pixel electrode 41 is formed later.

In other implementations, the first conductive layer 101 may include a material that has superior corrosion resistance compared to that of the second conductive layer 102. The second conductive layer 102 may include a material that has a lower resistance than the first conductively layer 101, so that current flows well.

Figure 3:
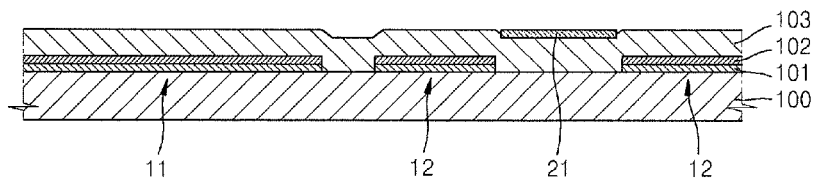

Next, as shown in FIG. 3, an auxiliary layer 103 and the active layer 21 of the thin film transistor TFT may be formed on the substrate 100 on which the first metal pattern 12 and the second metal pattern 11 are formed.

The auxiliary layer 103, such as a barrier layer, a blocking layer, and/or a buffer layer, may be formed on the substrate 100 to prevent or hinder the diffusion of impurity ions and penetration of moisture or air, and to planarize a surface of the substrate 100. The auxiliary layer 103 may be formed using $SiO_2$ and/or $SiN_x$ through various deposition methods such as a plasma-enhanced chemical vapor deposition (PECVD) method, an atmospheric pressure CVD (APCVD) method, or a low pressure CVD (LPCVD) method. The auxiliary layer 103 in a region in which the first metal pattern 12 and the second metal pattern 11 are formed may have a height greater than that in a region in which the first metal pattern 12 and the second metal pattern 11 are not formed. Accordingly, the auxiliary layer 103 may have a stepped portion. The auxiliary layer 103 may have a concave trench in regions in which the first metal pattern 12 and the 11 are not formed.

The active layer 21 of the thin film transistor TFT may be formed on the auxiliary layer 103. The active layer 21 may be formed by patterning polycrystalline silicon through dry etching. The active layer 21 may include a semiconductor and also may include ion impurities provided through doping. The active layer 21 may be formed of an oxide semiconductor. The active layer 21 is formed in a region in which the first metal pattern 12 and the second metal pattern 11 are not formed, i.e., in a trench of the auxiliary layer 103. Thus, a stepped portion may be compensated by the active layer 21 to prevent or hinder a capacitance coupling between the first and second metal patterns 12 and 11 and the active layer 21 from occurring.

Figure 4:
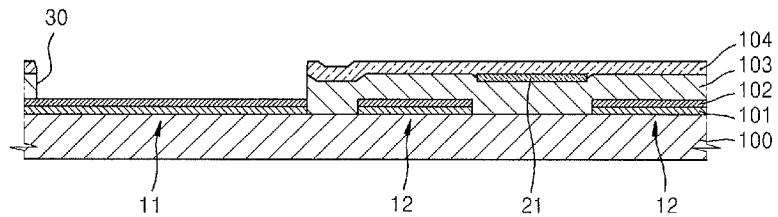

Next, as shown in FIG. 4, a first insulating layer 104 is formed on the substrate 100 on which the active layer 21 and the auxiliary layer 103 are formed, and an opening 30 exposing a portion of the second metal pattern 11 is formed.

The first insulating layer 104 may be formed by depositing an inorganic insulating layer, such as $SiN_x$ or $SiO_x$, through a PECVD method, an APCVD method, or an LPCVD method. The first insulating layer 104 may be disposed between the active layer 21 of the thin film transistor TFT and the gate electrode 23 to serve as a gate insulating layer of the thin film transistor TFT. The stepped portion may be compensated by the active layer 21. Accordingly, the first insulating layer 104 may have a superior step coverage. For example, a step wherein the first insulating layer 104 covers the active layer 21 may be reduced or minimized. In the embodiment, the step coverage of the insulating layer 104 may be controlled through the stepped portion formed on the auxiliary layer 103 disposed on the first metal pattern 12.

The auxiliary layer 103 and the first insulation layer 104 disposed on the second metal pattern 11 may be dry-etched in a batch process to form the opening 30 through which a portion of the second metal pattern 11 is exposed. Here, the second conductive layer 102 of the second metal pattern 11 may not be etched to prevent the first conductive layer 101 from being damaged by dry etching of the second conductive layer 102.

Figure 5:
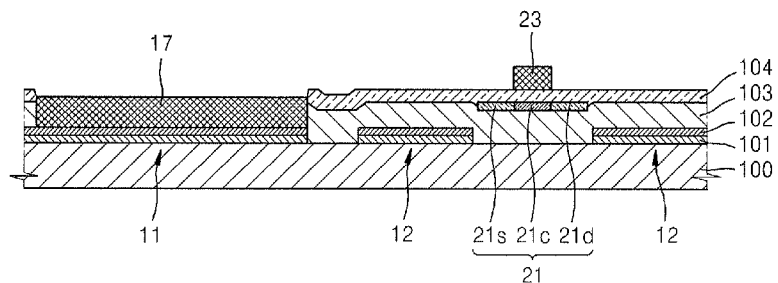

Next, as shown in FIG. 5, the gate electrode 23 of the thin film transistor TFT may be formed on the substrate 100.

A third conductive layer (not shown) may be formed on an entire surface of the substrate 100 on which the first insulating layer 104 is formed and patterned by using wet etching to form the gate electrode 23 of the thin film transistor TFT. The third conductive layer may be formed of various conductive materials. For example, the third conductive layer may include at least one material selected from Ag, Mg, Al, Pt, Pd, Au, Ni, Nd, Ir, Cr, Li, Ca, Mo, Ti, W, MoW, and Cu and may be a single or multilayer structure.

The gate electrode 23 may be formed to correspond to the center of the active layer 21. Then, n-type impurities or p-type impurities may be doped into the active layer 21 by using the gate electrode 23 as a self-alignment mask to form source and drain regions 21s and 21d on edges of the active layer 21 corresponding to respective sides of the gate electrode 23 and a channel region 21c between the source and drain regions 21s and 21d.

The third conductive layer formed in the opening 30 that is formed above the second metal pattern 11 may remain without being removed to form a third metal pattern 17 on the first metal pattern 12.

Figure 6:
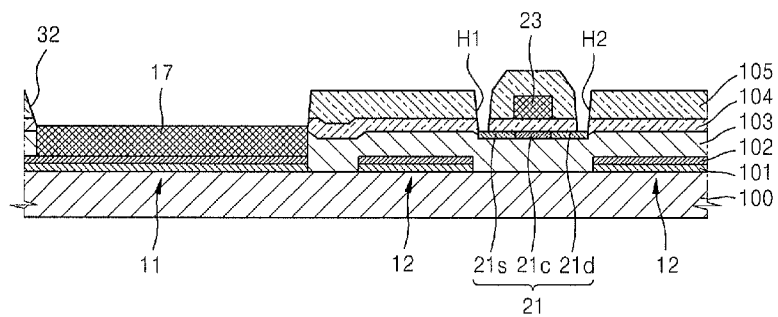

Next, as shown in FIG. 6, the second insulating layer 105 may be formed on the substrate 100 on which the gate electrode 23 is formed, and contact holes H1 and H2 and an opening 32 may be formed in the second insulating layer 105. The second insulating layer 105 may be dry-etched to form the contact holes H1 and H2 and the opening 32.

The second insulating layer 105 may be formed of an inorganic insulation material, such as described above with respect to first insulating layer 104, on an entire surface of the substrate 100. The second insulating layer 105 may serve as an interlayer insulating layer between the gate electrode 23 and the source and drain electrodes 25 and 27 of the thin film transistor TFT. The second insulating layer 105 may also include at least one organic insulating material selected from the group of polyimide, polyamide, acryl resin, benzocyclobutene, and phenol resin as well as the inorganic insulation materials. The organic insulation material and the inorganic insulation material may be alternately formed. The contact holes H1 and H2 respectively exposing portions of the source and drain regions 21s and 21d of the active layer 21 and the opening 32 exposing the third metal pattern 17 may be formed in the second insulating layer 105.

Figure 7:
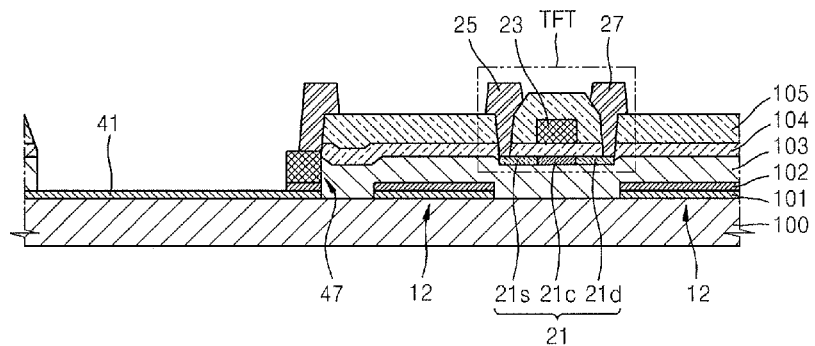

Next, as shown in FIG. 7, the source and drain electrodes 25 and 27 of the thin film transistor TFT and the pixel electrode 41 of the organic light emitting device EL may be formed on the substrate 100 on which the second insulating layer 105 is formed.

A fourth conductive layer (not shown) may be formed on the entire surface of the substrate 100 on which the second insulating layer 105 is formed and patterned by wet etching to form the source and drain electrodes 25 and 27. The fourth conductive layer may be formed of at least one material selected from the same conductive materials as the above-described third conductive layer, as an example. For example, the fourth conductive layer may be formed of various conductive materials. The source and drain electrodes 25 and 27 may be electrically connected to the source and drain regions 21s and 21d of the active layer 21 through the contact holes H1 and H2 of the second insulating layer 105.

The pixel electrode 41 may be formed by an additional etching process performed after the source and drain electrodes 25 and 27 are formed, or may be formed simultaneously with the source and drain electrodes 25 and 27. Portions of the second conductive layer 102 of the second metal pattern 11 and the third metal pattern 17 may be removed to form the pixel electrode 41 including the transparent conductive oxide. Portions of the second conductive layer 102 of the second metal pattern 11 and the third metal pattern 17 remaining in edge areas of the pixel electrode 41 may serve as the metallic connecting layer 47. The pixel electrode 41 is electrically connected to one of the source and drain electrodes 25 and 27 of the thin film transistor TFT through the metallic connecting layer 47.

Figure 8:
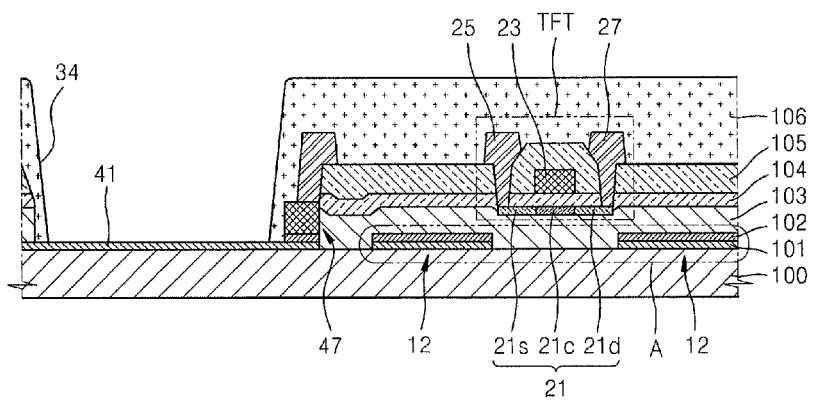

Next, as shown in FIG. 8, the third insulating layer 106 may be formed on the substrate 100.

In detail, the third insulating layer 106 may be deposited on the entire surface of the substrate 100 on which the pixel electrode 41 and the source and drain electrodes 25 and 27 are formed. The third insulating layer 106 may be formed by performing spin coating using at least one organic insulating material selected from the group of polyimide, polyamide, acryl resin, benzocyclobutene, and phenol resin. The third insulating layer 106 may be formed of an inorganic insulation material selected from $SiO_2$, $SiN_x$, $Al_2O_3$, $CuO_x$, $Tb_4O_7$, $Y_2O_3$, $Nb_2O_5$, and $Pr_2O_3$ as well as the organic insulation material. Also, the third insulating layer 106 may be formed as a multilayer structure in which the organic insulation material and the inorganic insulation material are alternately disposed. The third insulating layer 106 may be patterned to form an opening 34 exposing a portion of the pixel electrode 41. The third insulating layer 106 may serve as a pixel define layer (PDL) defining a pixel. The third insulating layer 106 may be in contact with the edge areas of the pixel electrode 41 and may cover the metallic connecting layer 47.

Thereafter, as shown in FIG. 1, an intermediate layer 43 including an organic emissive layer (EML) and an opposite electrode 45 may be formed in the opening 34 exposing the pixel electrode 41.

The intermediate layer 43 may include the EML and at least one functional layer having a single or complex structure in which a hole transport layer (HTL), a hole injection layer (HIL), an electron transport layer (ETL), and an electron injection layer (EIL) are stacked on each other. The EML may be formed of a low or high molecular organic material. If the EML respectively emits red, green, and blue light, the EML may be patterned into a red light emitting layer, a green light emitting layer, and a blue light emitting layer. If the EML emits white light, the EML may have a multilayer structure in which the red light emitting layer, the green light emitting layer, and the blue light emitting layer are stacked to emit the white light, or may have a single layer (monolayer) structure including a red light emitting material, a green light emitting material, and a blue light emitting material.

The opposite electrode 45 may be deposited on an entire surface of the substrate 100 to serve as a common electrode. The opposite electrode 45 may be provided as a reflective electrode. The reflective electrode may be formed by thinly depositing a metal having a low work function, for example, Ag, Mg, Al, Pt, Pd, Au, Ni, Nd, Ir, Cr, Li, Ca, LiF/Ca, LiF/Al, or a combination thereof. Since the opposite electrode 45 is provided as the reflective electrode, light emitted from the EML is reflected by the opposite electrode 45 and passes through the pixel electrode 41 formed of the transparent conductive oxide. Thereafter, the light is emitted onto the substrate 100.

Figure 9:
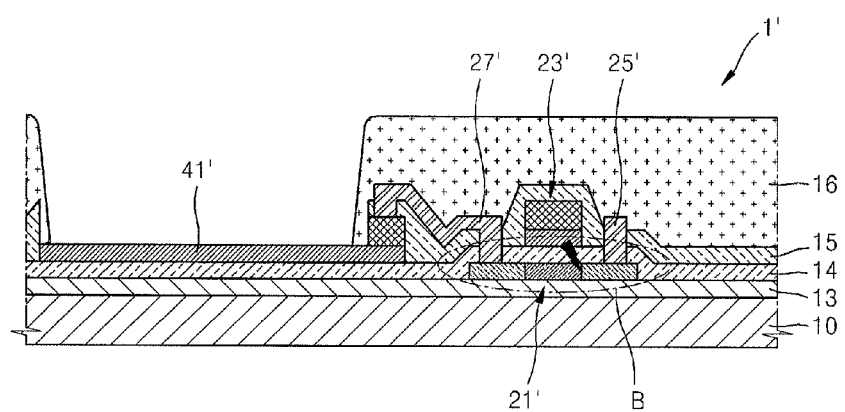
FIG. 9 illustrates a cross-sectional view of a comparative example for explaining an effect thereof.

FIG. 9 is a cross-sectional view of a comparative example for explaining an effect of a present embodiment.

Referring to FIG. 9, an auxiliary layer 13 is disposed first on a substrate 10, and then an active layer 21' of a thin film transistor TFT is disposed on the auxiliary layer 13. Then, a first insulating layer 14 is disposed on the active layer 21' as a gate insulating layer, and then a gate electrode 23' is disposed on the first insulating layer 14. The gate electrode 23' includes a lower layer including a transparent conductive metal oxide and an upper layer including a metal material. A second insulating layer 15 is disposed on the gate electrode 23' as an interlayer insulating layer, and source and drain electrodes 25' and 27' are formed on the second insulating layer 15. The pixel electrode 41' is disposed on the same layer as and is formed of the same material as a lower layer of the gate electrode 23', and the pixel electrode 41' is electrically connected to one of the source and drain electrodes 25' and 27'. A third insulating layer 16 exposing a portion of the pixel electrode 41' is disposed on the source and drain electrodes 25' and 27' as a pixel define layer (PDL).

In an organic light emitting display 1' illustrated in FIG. 9, the active layer 21' of the thin film transistor TFT directly contacts the auxiliary layer 13 disposed on the substrate 10. Accordingly, as shown in a region B, static electricity introduced from the substrate 10 into the thin film transistor TFT through the auxiliary layer 13 may be introduced into the active layer 21', causing a short circuit between the active layer 21' and the gate electrode 23'. As a result, line defects and point defects may occur in the organic light emitting display 1'.

Also, in the organic light emitting display 1' illustrated in FIG. 9, when the active layer 21' has an increased thickness or profile, a stepped portion may occur on the first insulating layer 14 that is a gate insulating layer due to the active layer 21', thus deteriorating the step coverage of the gate insulating layer. Thus, electrostatic breakdown voltage characteristics (i.e., breakdown voltage (BV) characteristics) may be weakened, which may result in the deterioration of device reliability and thereby may cause progressive defects when the panel operates for a long time.

However, as shown in region A of FIG. 8, in the organic light emitting display 1 according to an embodiment, a first metal pattern 12 is formed first on the substrate 100, and then an auxiliary layer 103 is formed on the first metal pattern 12. The first metal pattern 12 is formed in a region around the thin film transistor, excluding a region on which the active layer 21 is formed. Accordingly, static electricity introduced from the substrate 100 is moved and dispersed by the first metal pattern 12 to prevent a short circuit between the active layer 21 and the gate electrode 23 from occurring. Therefore, point defects and line defects occurring in the organic light emitting display 1 may be reduced or prevented.

Also, in the organic light emitting display 1 according to the embodiment, the stepped portion may be formed on the auxiliary layer 103 by the first metal pattern 12, and thus the active layer 21 may be formed in a trench region of the auxiliary layer 103. The characteristics of the organic light emitting display 1 may not depend on the thickness or profile of the active layer 21. Accordingly, the process margin of the dry etching may be improved during the patterning of the active layer 21. Also, the first insulating layer 104 functioning as the gate insulating layer disposed on the active layer 21 may have a superior step coverage regardless of the thickness or profile of the active layer 21, thus improving the breakdown voltage (BV) characteristics of the thin film transistor TFT. Unlike the insulating layer 14 in the comparative example illustrated in FIG. 9, the first insulating layer 104 according to an embodiment may have no step or a minimal step where the first insulating layer 104 covers the active layer 21.

Also, in the organic light emitting display 1 according to the embodiment, the pixel electrode 41 may directly contact the substrate 100. Thus, the planarizing effect of the organic light emitting device EL may be achieved.

A sealing member (not shown) and moisture absorbent (not shown) for protecting the light emitting layer against external moisture or oxygen may be further disposed on the opposite electrode 45.

In the organic light emitting display according to an embodiment, the metal pattern is disposed on the substrate. Accordingly, static electricity introduced into the thin film transistor may be dispersed to secure the improved electrostatic breakdown voltage characteristics.

By way of summation and review, a substrate of an organic light emitting display is exposed to the outside. Accordingly, static electricity generated due to external environmental factors may have an influence on the thin film transistor of the organic light emitting display and may cause image quality defects in the display.

In contrast, embodiments provide an organic light emitting display having a thin film transistor that is not affected by external environmental conditions.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. An organic light emitting display, comprising:
   a substrate;
   a metal pattern on the substrate, the metal pattern directly contacting the substrate, the metal pattern includes a lower layer including a transparent conductive metal oxide and an upper layer including a conductive material; and
   a thin film transistor including:
   an active layer spaced apart from the metal pattern on the substrate,
   a gate electrode on the active layer, and
   a source electrode and a drain electrode on the gate electrode.

2. The organic light emitting display as claimed in claim 1, wherein the metal pattern is not in a region of the substrate in which the active layer is located.

3. The organic light emitting display as claimed in claim 1, wherein the upper layer of the metal pattern includes at least one material selected from Ag, Mg, Al, Pt, Pd, Au, Ni, Nd, Ir, Cr, Li, Ca, Mo, Ti, W, MoW, and Cu.

4. The organic light emitting display as claimed in claim 1, further comprising an auxiliary layer between the metal pattern and the active layer, the auxiliary layer having a stepped portion based on the metal pattern.

5. The organic light emitting display as claimed in claim 4, further comprising a gate insulating layer between the active layer and the gate electrode, wherein the gate insulating layer is controlled in step coverage through the stepped portion of the auxiliary layer.

6. The organic light emitting display as claimed in claim 1, further comprising a pixel electrode formed of a same material and in a same layer as the metal pattern, the pixel electrode directly contacting the substrate.

7. An organic light emitting display, comprising:
   a substrate;
   a metal pattern on the substrate, the metal pattern being provided as a multiple layer;
   an auxiliary layer on the metal pattern;
   an active layer on the auxiliary layer;
   a gate insulating layer on the active layer;
   a gate electrode on the gate insulating layer;
   a source electrode and a drain electrode on the gate electrode, the source electrode and the drain electrode being electrically connected, respectively, to a source region and a drain region of the active layer; and
   a pixel electrode electrically connected to one of the source electrode and the drain electrode, the pixel electrode being formed of a same material and on a same layer as a lower layer of the metal pattern and directly contacting the substrate.

8. The organic light emitting display as claimed in claim 7, wherein the metal pattern directly contacts the substrate except for in a region in which the active layer is disposed.

9. The organic light emitting display as claimed in claim 7, wherein the auxiliary layer includes a stepped region based on the metal pattern, and
   the gate insulating layer is controlled in step coverage through the stepped region of the auxiliary layer.

10. A method for manufacturing an organic light emitting display, the method comprising:
    forming a first metal pattern on a substrate such that the first metal pattern directly contacts the substrate, forming the first metal pattern including stacking a lower conductive layer including a transparent conductive metal oxide and an upper conductive layer including a conductive material and patterning the lower conductive layer and the upper conductive layer; and
    forming a thin film transistor including an active layer, a gate electrode formed on the active layer, and a source electrode and a drain electrode formed on the gate electrode.

11. The method as claimed in claim 10, wherein the first metal pattern is not formed in a region in which the active layer is to be formed.

12. The method as claimed in claim 10, wherein the upper conductive layer of the first metal pattern includes at least one material selected from Ag, Mg, Al, Pt, Pd, Au, Ni, Nd, Ir, Cr, Li, Ca, Mo, Ti, W, MoW, and Cu.

13. The method as claimed in claim 10, wherein forming the thin film transistor includes:
    forming an auxiliary layer on the first metal pattern;
    forming the active layer on the auxiliary layer;
    forming a gate insulating layer on the active layer;
    forming the gate electrode on the gate insulating layer;
    forming an interlayer insulating layer on the gate electrode; and
    forming the source electrode and the drain electrode to be electrically connected, respectively, to a source region and a drain region of the active layer.

14. The method as claimed in claim 13, wherein the auxiliary layer includes a stepped portion based on the first metal pattern, and
    the gate insulating layer is controlled in step coverage through the stepped portion of the auxiliary layer.

15. The method as claimed in claim 10, further comprising:
    forming a second metal pattern of a same material and in a same layer as the first metal pattern;
    forming a third metal pattern of a same material as the gate electrode on the second metal pattern; and
    removing the third metal pattern and an upper conductive layer of the second metal pattern while the source electrode and the drain electrode are formed, to form a pixel electrode.

16. The method as claimed in claim 15, further comprising:
    forming an auxiliary layer on the second metal pattern;
    forming a gate insulating layer on the auxiliary layer;

patterning the auxiliary layer and the gate insulating layer to form a first opening exposing the second metal pattern;

forming the third metal pattern on the first opening;

forming an interlayer insulating layer on the third metal pattern; and forming the pixel electrode by removing the interlayer insulating layer, the third metal pattern, and the upper conductive layer of the second metal pattern while the source electrode and the drain electrode are formed.

* * * * *